United States Patent
Gu et al.

(10) Patent No.: US 11,532,745 B2
(45) Date of Patent: Dec. 20, 2022

(54) INTEGRATED CIRCUIT STRUCTURE INCLUDING ASYMMETRIC, RECESSED SOURCE AND DRAIN REGION AND METHOD FOR FORMING SAME

(71) Applicant: GLOBALFOUNDRIES U.S. Inc., Santa Clara, CA (US)

(72) Inventors: Man Gu, Malta, NY (US); Wenjun Li, Saratoga Springs, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 130 days.

(21) Appl. No.: 16/806,319

(22) Filed: Mar. 2, 2020

(65) Prior Publication Data

US 2021/0273094 A1    Sep. 2, 2021

(51) Int. Cl.
*H01L 29/772* (2006.01)
*H01L 29/78* (2006.01)
*H01L 29/66* (2006.01)
*H01L 29/165* (2006.01)

(52) U.S. Cl.
CPC ........ *H01L 29/7835* (2013.01); *H01L 29/165* (2013.01); *H01L 29/6656* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 5,763,913 A * | 6/1998 | Jeong | H01L 29/42324 257/317 |
| 8,633,082 B2 | 1/2014 | Lasserre et al. | |
| 2009/0090980 A1 | 4/2009 | King et al. | |
| 2012/0080721 A1 * | 4/2012 | Liao | H01L 29/165 257/E21.403 |
| 2012/0161238 A1 * | 6/2012 | Scheiper | H01L 21/823412 257/E21.409 |
| 2012/0261718 A1 * | 10/2012 | Sosa Cortes | H01L 29/7848 257/E21.409 |
| 2013/0214357 A1 | 8/2013 | Chang et al. | |
| 2014/0252477 A1 * | 9/2014 | Tseng | H01L 29/66795 438/151 |
| 2016/0118462 A1 * | 4/2016 | Tseng | H01L 21/845 257/386 |
| 2019/0334011 A1 * | 10/2019 | Cheng | H01L 29/41791 |

* cited by examiner

*Primary Examiner* — Ali Naraghi
(74) *Attorney, Agent, or Firm* — Francois Pagette; Hoffman Warnick LLC

(57) ABSTRACT

Integrated circuit (IC) structures including asymmetric, recessed source and drain regions and methods for forming are provided. In an example, the IC structure includes a substrate, a gate structure over the substrate, first and second spacers contacting respective, opposite sidewalls of the gate structure, and source and drain regions on opposite sides of the gate structure. In one configuration, the source region includes an upper source portion having a first lateral width, and a lower source portion having a second lateral width greater than the first lateral width, and the drain region includes an upper drain portion having a third lateral width, and a lower drain portion having a fourth lateral width that is substantially the same as the third lateral width.

18 Claims, 19 Drawing Sheets

INTEGRATED CIRCUIT STRUCTURE INCLUDING ASYMMETRIC, RECESSED SOURCE AND DRAIN REGION AND METHOD FOR FORMING SAME

TECHNICAL FIELD

The present disclosure relates to methods of forming an integrated circuit (IC) structure, and structures associated with the disclosed methods. More particularly, the present disclosure relates to forming types of IC components, e.g., transistors, by recessing semiconductor regions to form asymmetric, recessed source and drain regions.

BACKGROUND

For integrated circuit (IC) structures used in certain applications, for example, radio frequency (RF) applications, high source and drain resistance and/or high gate to source and drain capacitance reduces device performance. Techniques in addressing such issues with resistance and capacitance include source and drain region geometry tuning and/or doping profile tuning. However, conventional methods for reducing source and drain resistance often simultaneously increase the gate to source and drain capacitance. Similarly, techniques for reducing gate to source and drain capacitance often simultaneously increase source and drain resistance, thereby degrading drive performance.

SUMMARY

A first aspect of the present disclosure provides an integrated circuit (IC) structure, including: a substrate; a gate structure over the substrate, the gate structure having a first gate sidewall and an opposite, second gate sidewall and including a gate region and a gate dielectric layer formed under the gate region; a first spacer contacting the first gate sidewall of the gate structure; a second spacer contacting the opposite, second gate sidewall of the gate structure; and a source region and a drain region adjacent and on opposite sides of the gate structure, where the source region includes an upper source portion above the gate dielectric layer and having a first lateral width, and a lower source portion below the upper source portion and having a second lateral width greater than the first lateral width, and where the drain region includes an upper drain portion above the gate dielectric layer and having a third lateral width, and a lower drain portion below the upper drain portion and having a fourth lateral width that is substantially the same as the third lateral width.

A second aspect of the present disclosure provides an integrated circuit (IC) structure, including: a substrate; a gate structure over the substrate, the gate structure having a first gate sidewall and an opposite, second gate sidewall and including a gate region and a gate dielectric layer formed under the gate region; a first spacer contacting the first gate sidewall of the gate structure; a second spacer contacting the opposite, second gate sidewall of the gate structure; and a source region and a drain region adjacent and on opposite sides of the gate structure, where the source region includes a source portion below the gate dielectric layer, the source portion having a source sidewall that is laterally offset from the first gate sidewall of the gate structure to a first lateral distance, and where the drain region includes a drain portion below the gate dielectric layer, the drain portion having a drain sidewall that is laterally offset from the second gate sidewall of the gate structure to a second lateral distance that is greater than the first lateral distance.

A third aspect of the present disclosure provides a method of forming an integrated circuit (IC) structure, the method including: forming a gate structure over a substrate, the gate structure having a first gate sidewall on a first side of the gate structure, and a second gate sidewall on a second side of the gate structure opposite to the first side, and the gate structure further including a gate region and a gate dielectric layer formed under the gate region; forming a source region in a first opening including an undercut region adjacent to the first side of the gate structure, the source region includes an upper source portion above the gate dielectric layer and having a first lateral width, and a lower source portion below the upper source portion and having a second lateral width greater than the first lateral width; forming a drain region in a second opening adjacent to the second side of the gate structure, where the drain region has a uniform lateral width; and forming a first spacer contacting the first gate sidewall of the gate structure, and a second spacer contacting the second gate sidewall of the gate structure.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
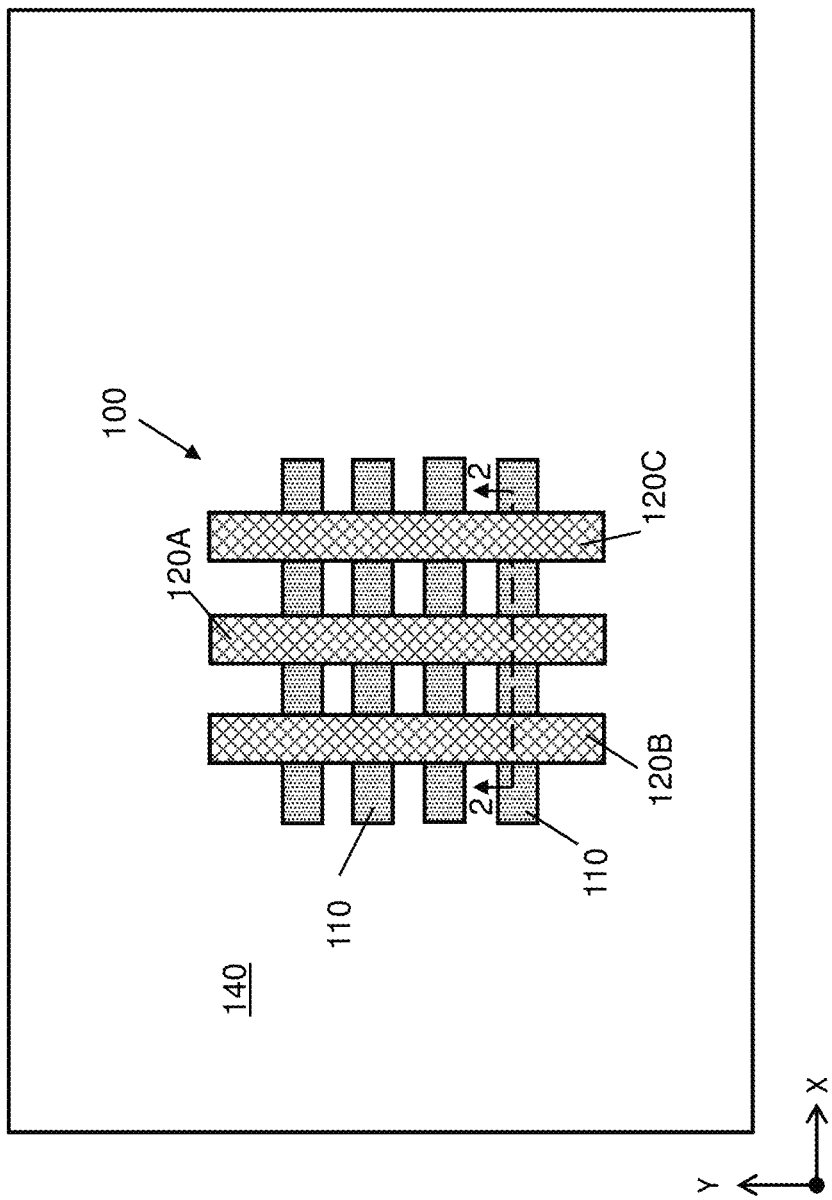
FIG. 1 shows a plan view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

FIG. 1 provides a plan view of a structure 100 to be processed according to embodiments of the disclosure. The example structure 100 of FIG. 1 provides one preliminary set of materials targeted for use with embodiments of the disclosure, but it is understood that embodiments of the disclosure may be implemented on different designs without significant changes to the various example techniques discussed herein. Structure 100 may include a set (i.e., one or more) of semiconductor regions from which transistor structures may be formed. Semiconductor regions can be formed in a variety of ways from an initial substrate. Various embodiments may include regions of semiconductor material in the form of semiconductor fins (simply "fin(s)" or "fin" hereafter) 110 extending in parallel with each other. Structure 100 may include a set (i.e., one or more) of fin(s) 110 extending in a first direction. FIG. 1 provides an example including four fins 110, but structure 100 may include any desired number of fins 110. Structure 100 may also include a set (i.e., one or more) of gate structure(s) 120 each extending transversely over fin(s) 110, with each gate structure 120 having one or more regions positioned over corresponding fin(s) 110 in structure 100. In FIG. 1, three gate structures 120A, 120B and 120C are shown, but structure 100 may include any desired number of gate structure(s) 120. Gate structures 120A, 120B and 120C may be generally referred to as gate structure(s) 120 hereafter. A shallow trench isolation (STI) 140 (shown without cross-hatching in FIG. 1 solely for clarity) of structure 100 may be positioned underneath and/or adjacent to fin(s) 110 and gate structure(s) 120. STI 140 may be formed of any currently-known or later developed material for providing electrical insulation, and as examples may include, but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Figure 2:
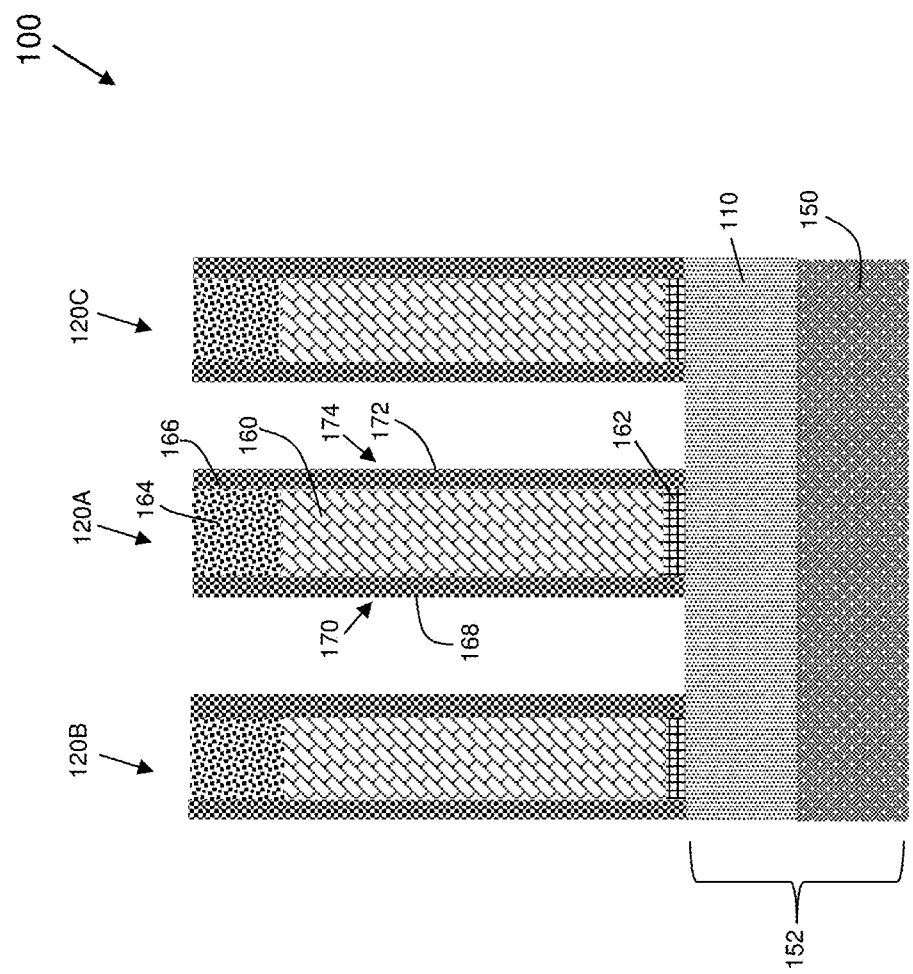
FIG. 2 shows a first cross-sectional view, along line 2-2 of FIG. 1, of the initial structure according to embodiments of the disclosure.

Referring to FIG. 2, fin(s) 110 and gate structure(s) 120 of structure 100 are shown in further detail. Each fin 110 may be formed from an underlying semiconductor substrate or a base substrate 150, e.g., by removing targeted portions of base substrate 150 to a predetermined depth, causing the non-removed portions to form fin(s) 110 directly on base substrate 150. Regions including, but not limited to, fin(s) 110 and base substrate 150 may be referred to as a substrate 152 throughout the present disclosure. Base substrate 150 may include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

The current disclosure provides embodiments including gate structure(s) 120 including one or more functional components, for example, one or more conductive components, to be used in a complete IC structure for providing a gate terminal of a transistor, e.g., in a "gate first" processing paradigm. However, it is to be understood that the current disclosure is not limited to gate structure(s) 120 that include functional components and processes and resulting structures described in the non-limiting examples described. For example, each gate structure 120 may lack one or more functional components used in a complete IC structure, and may include one or more dummy gates to be processed at a different stage of forming a product. Such components may be eventually replaced with functional elements in other process steps, e.g., by using a replacement metal gate (RMG) processing paradigm. Gate structure(s) 120 may cover one or more fins 110, e.g., by coating exposed sidewalls and an upper surface of fin(s) 110. Gate structure(s) 120 may be formed over substrate 152. In certain embodiments, each gate structure 120 may include a gate region 160 and a gate dielectric layer 162 formed under gate region 160. Gate region 160 may include one or more precursor semiconductor materials formed on gate dielectric layer 162, e.g., to allow other portions of a structure to be formed before gate structure 120 is replaced with functional conductive components. In other cases, gate region 160 may include one or more conductive components for providing a gate terminal of a transistor, e.g., in a "gate first" processing paradigm. Embodiments of the disclosure may be implemented without regard to whether gate region 160 is formed of a precursor material (e.g., semiconductor) or an active material (e.g., metal). Each gate structure 120 also may include a gate cap 164 over gate region 160. Gate cap 164 may include one or more insulative materials configured to protect underlying portions of gate region 160 from being removed, modified, implanted, etc., as other portions of a structure are formed.

For instance, gate cap 164 may include silicon nitride ($Si_3N_4$) and/or other insulative materials noted herein.

Each gate structure 120 may also optionally include insulative layer(s) 166 formed adjacent to gate region 160 and/or gate dielectric layer 162. Insulative layer(s) 166 may be provided as one or more bodies of insulating material formed on exposed portions of STI 140 and/or gate structure(s) 120, e.g., by deposition/etching, thermal growth, etc. Insulative layer(s) 166 may be formed on or adjacent to gate structure(s) 120 to electrically and physically separate gate structure(s) 120 from other components of structure 100 (FIG. 1). Insulative layer(s) 166 may include one or more low-K dielectric materials, i.e., dielectric materials with a dielectric constant of at most approximately 3.9. Insulative layer(s) 166, for example, may include one or more insulative oxide and/or nitride materials. In some cases, insulative layer(s) 166 may include one or more insulative materials included in STI 140 or a different insulative material. Each gate structure 120 further includes a first gate sidewall 168 on a first side 170 of gate structure 120, and an opposite, second gate sidewall 172 on a second side 174 of gate structure 120 opposite to first side 170 of gate structure 120.

Figure 3:
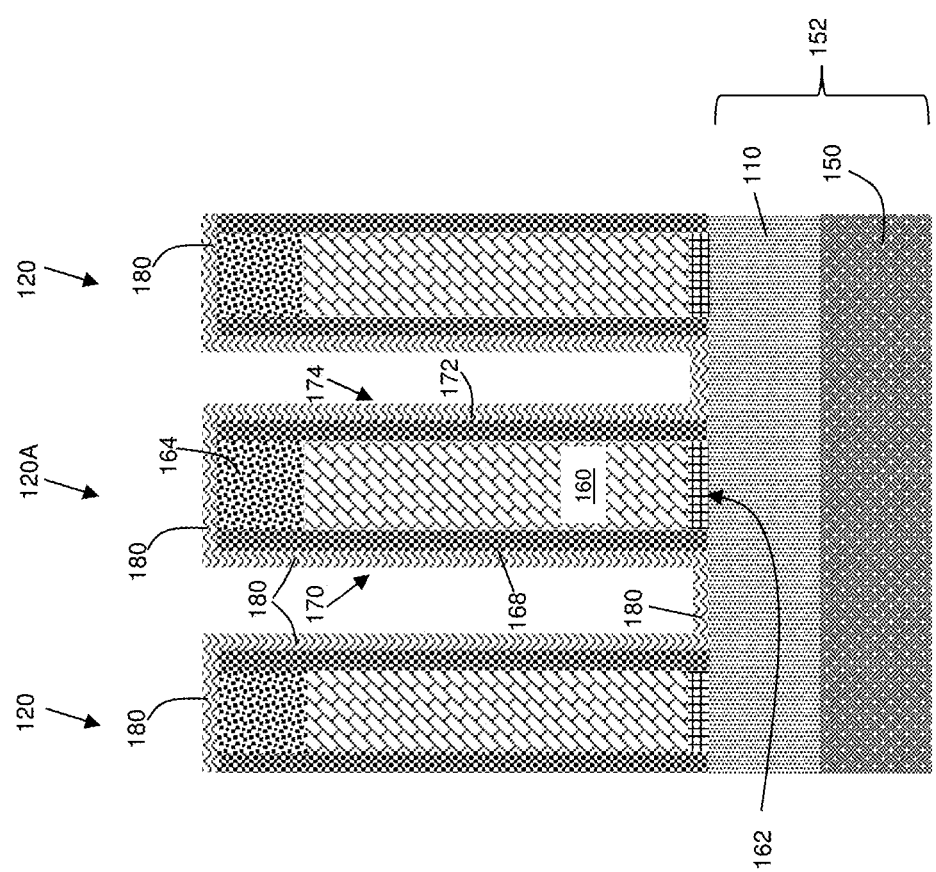
FIG. 3 shows a cross-sectional view of forming a first film according to embodiments of the disclosure.

Proceeding to FIG. 3, a first film 180 may be formed over or adjacent to gate structure(s) 120. First film 180 (or simply "film 180" hereafter) may be formed or deposited along first gate sidewall(s) 168 and second gate sidewall(s) 172 of gate structure(s) 120. Film 180 may additionally be formed over gate cap(s) 164 and fins 110. Film 180 may be provided as one or more bodies of insulating material formed on exposed portions of fin(s) 110 and/or gate structure(s) 120, e.g., by deposition/etching, thermal growth, etc. Film 180 may include one or more low-K dielectric materials, i.e., dielectric materials with a dielectric constant of at most approximately 3.9. Film 180 may include one or more insulative oxide and/or nitride materials. In some cases, film 180 may include one or more insulative materials included in STI 140 or a different insulative material. It is to be understood that while film 180 may include same or different insulative material as insulative layer(s) 166 of gate structure(s) 120, film 180 does not form part of gate structure(s) 120. Rather, film 180 are formed as preliminary spacer material(s) selected for ease of removal and replacement in subsequent processing. In some embodiments, film 180 may be preliminary spacer material(s) formed over or adjacent to gate structure(s) 120. In contrast, optional insulative layer(s) 166 of gate structure(s) 120, if present, form part of gate structure(s) 120.

Figure 4:
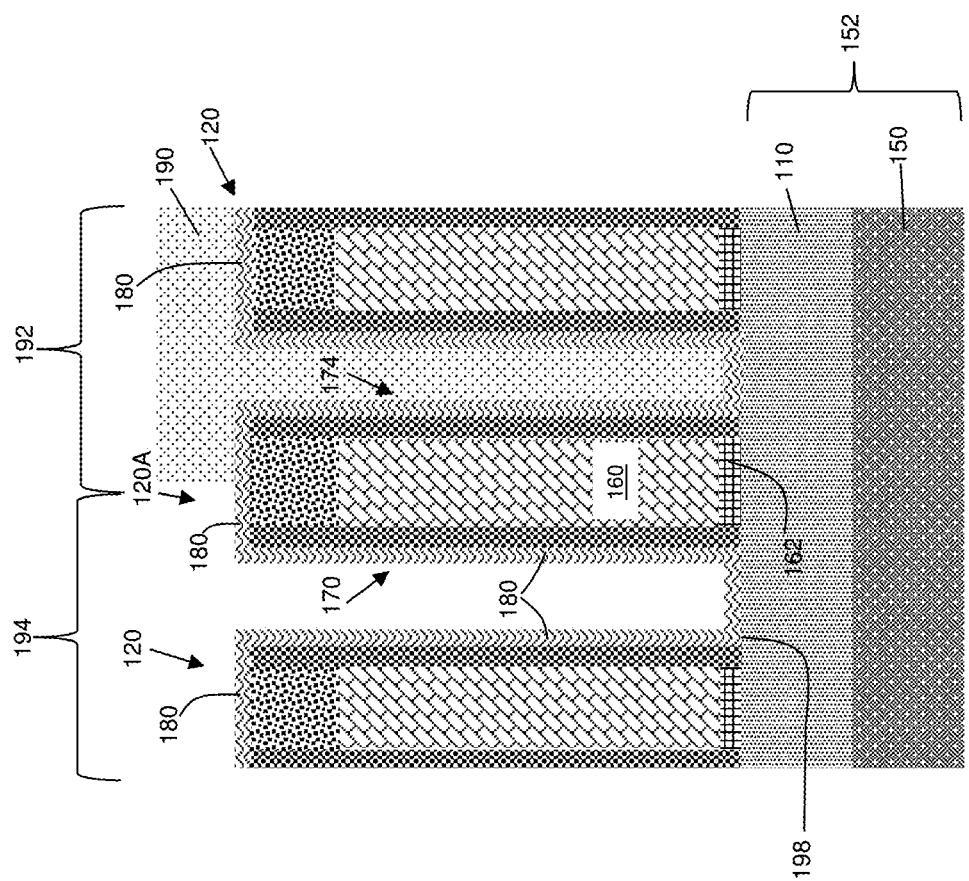
FIG. 4 shows a cross-sectional view of forming a first mask over a first semiconductor region according to embodiments of the disclosure.

Proceeding to FIG. 4, a first mask 190 may be formed over substrate 152 to cover a first semiconductor region 192 without covering a second semiconductor region 194 over substrate 152. First semiconductor region 192 may be a region over and adjacent to second side 174 of gate structure 120. Second semiconductor region 194 may be a region over and adjacent to first side 170 of gate structure 120. First mask 190 may include openings or otherwise may be structured not to cover second semiconductor region 194 on substrate 152. Second semiconductor region 194 not covered by mask 190 remains susceptible to processing when mask 190 remains in place over first semiconductor region 192 on substrate 152. As discussed herein, mask 190 may protect first semiconductor region 192 from being recessed, implanted, etc. Locations not covered by mask 190 may be susceptible to processing, e.g., by various etchants as discussed herein, while other materials beneath mask 190 will be protected.

Mask 190 may be formed using any now known or later developed techniques, and may include any now known or later developed mask materials. In one non-limiting example, mask 190 may take a form of one or more insulative materials, and in other cases may wholly or partially include a planarization material such as an organic planarization layer (OPL). As used herein and throughout the present disclosure, a "planarization layer" generally refers to any material formed on a surface to produce a planar surface, and may be formed by, e.g., deposition of a material followed by polishing, deposition of a material followed by forming of a flowable oxide material thereon, deposition of a material alone, and/or any other currently known or later developed process or combination of processes. In this case, mask 190 may include one or more carbon films removable by wet etching and/or dry etching processes. Mask 190 may be formed by blanket depositing of OPL material over each exposed structural element to be covered by mask 190, and then etching the OPL material back to a desired height over fin(s) 110, STI 140, or substrate 152, etc.

Figure 5:
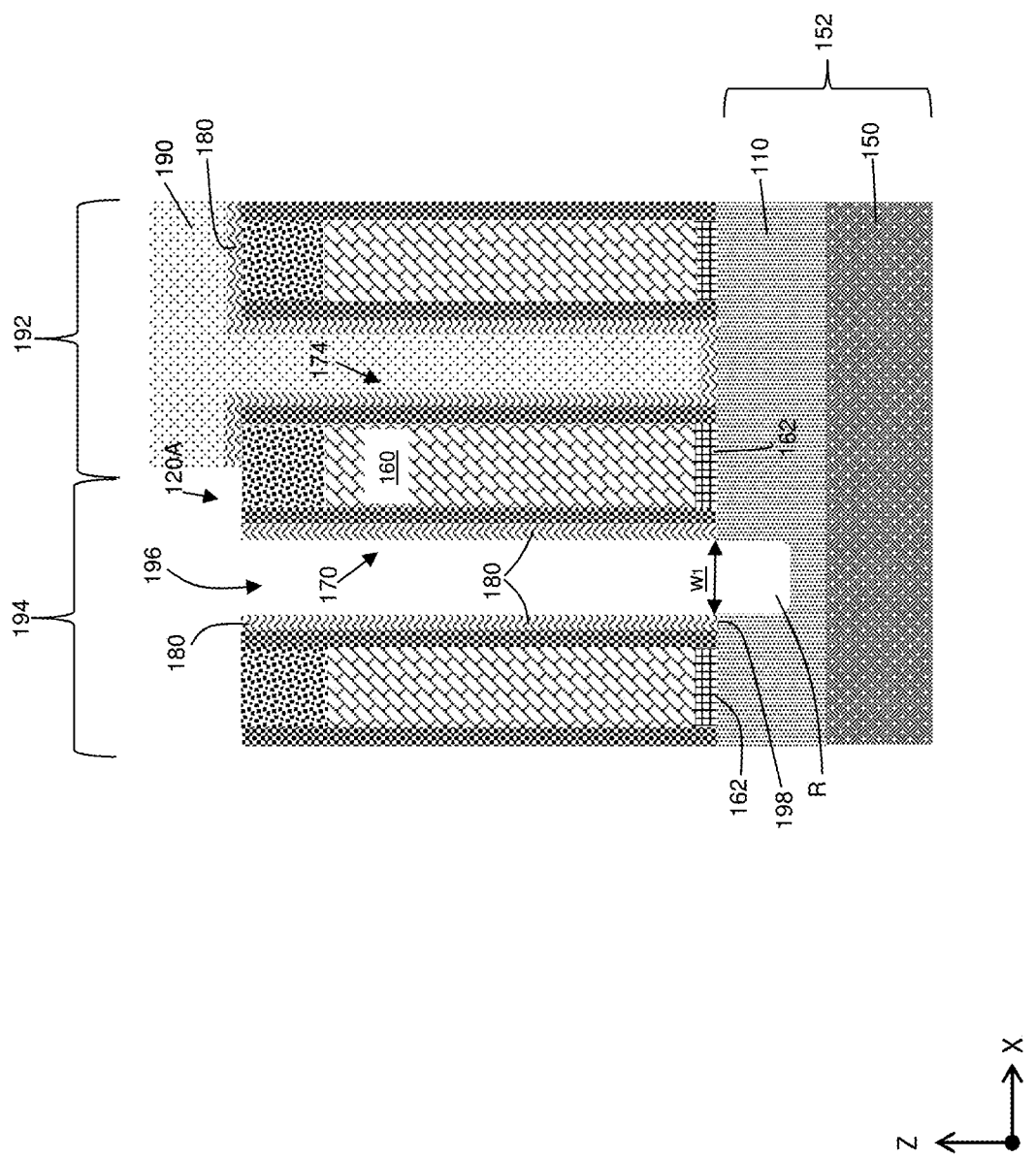
FIG. 5 shows a cross-sectional view of recessing a second semiconductor region according to embodiments of the disclosure.

Proceeding to FIG. 5, with mask 190 in place, further processing according to the present disclosure may include etching a portion of substrate 152, e.g., recessing a portion of substrate 152 in second semiconductor region 194 over and adjacent to first side 170 of gate structure 120, and thus removing a portion of film 180 on second semiconductor region 194 to form a first opening 196 over substrate 152. In embodiments, first opening 196 includes a region R below a lower extent 198 of first film 180 and a lower extent of gate dielectric layer 162. First opening 196 may have an opening width ($w_1$) that is substantially uniform throughout.

Mask 190 prevents first semiconductor region 192 from being affected during the etching. Portions of second semiconductor region 194 not covered by mask 190 or gate structure(s) 120 may be etched, e.g., using a downward directional etch. As used herein and throughout the present disclosure, "etching" generally refers to the removal of material from a substrate (or structures formed on the substrate), and is often performed with a mask in place so that material may selectively be removed from certain areas of the substrate, while leaving the material unaffected in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In the instant case, the etching may include, for example, a RIE. As portions of first film 180 on second semiconductor region 194 at first side 170 of gate structure 120 is etched or recessed, gate structure 120 may protect portions of the fin material thereunder from being etched.

Figure 6:
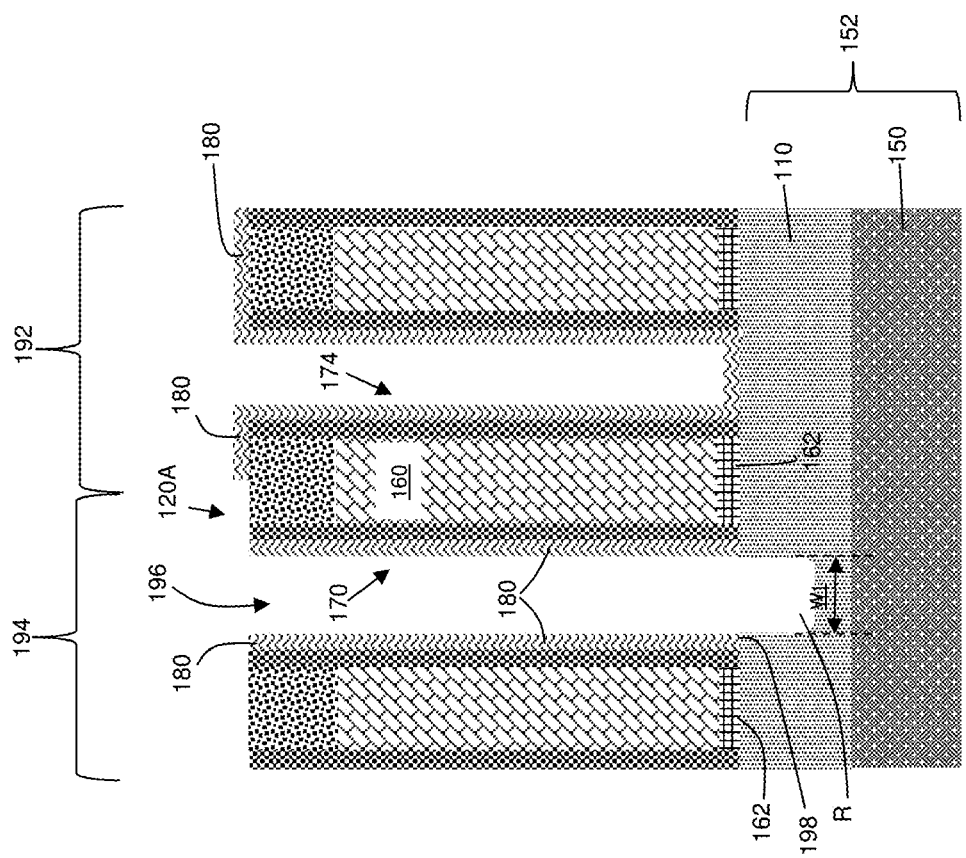
FIG. 6 shows a cross-sectional view of removing the first mask according to embodiments of the disclosure.

Proceeding to FIG. 6, first mask 190 may be removed from first semiconductor region 192 by any currently known or later developed technique including, but not limited to, stripping, selective etch, and/or other techniques suitable for mask removal.

Figure 7:
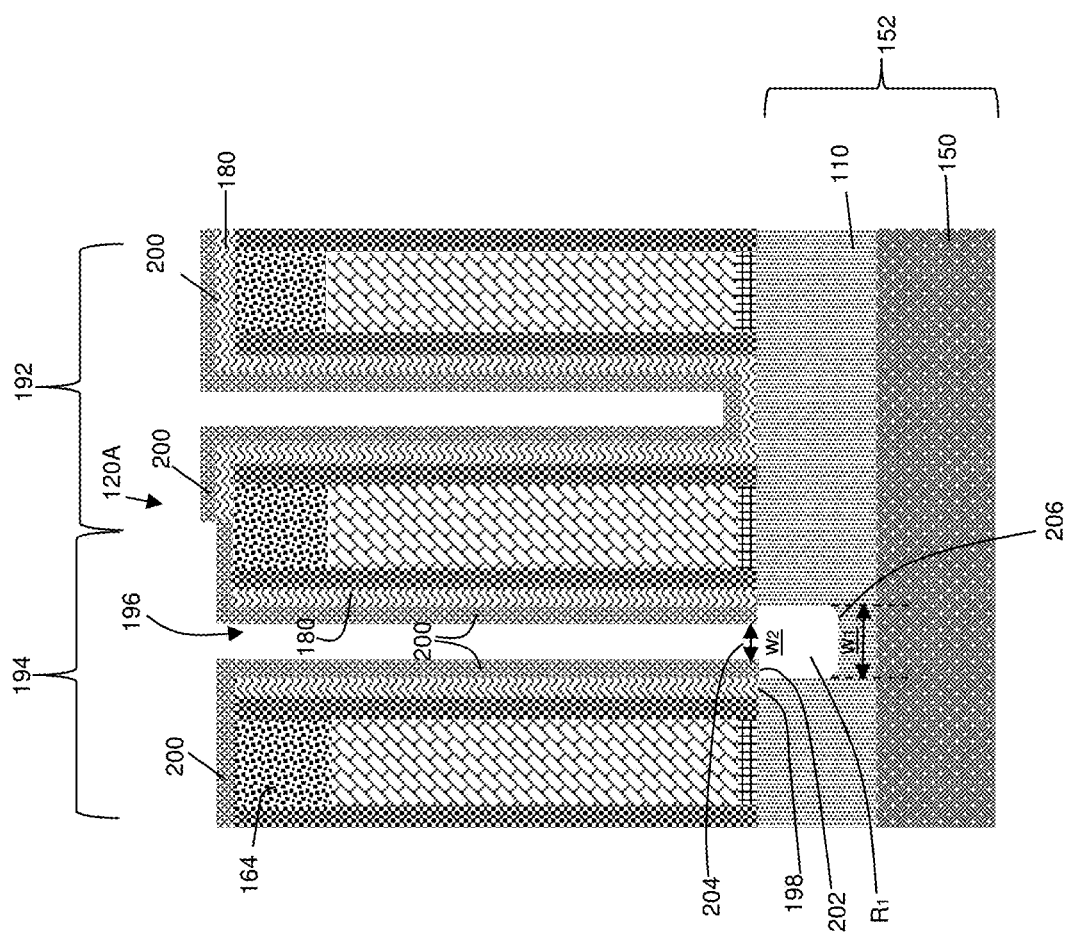
FIG. 7 shows a cross-sectional view of forming a second film according to embodiments of the disclosure.

Turning to FIG. 7, a second film 200 may be formed over remaining portion(s) of first film 180 such that portion(s) of second film 200 extends laterally (i.e. along x-axis as illustrated) over a portion of first opening 196 such that opening width ($w_1$) of first opening 196 is reduced, forming an undercut region $R_1$ below lower extent 198 of first film 180 and a lower extent 202 of second film 200. Undercut region $R_1$, or a portion thereof, has a reduced opening width ($w_2$) compared to opening width ($w_1$) of first opening 196 including region R (FIG. 6), due to portion(s) of second film 200 extending laterally over region R. In embodiments, undercut region $R_1$ includes a modified opening 204 having reduced opening width ($w_2$). Undercut region $R_1$ may further include a lower extent 206 opposite to modified opening 204, where lower extent 206 has substantially the same width as opening width ($w_1$) of first opening 196 including region R (FIG. 6). Reduced opening width ($w_2$) of undercut region $R_1$ may be controlled by controlling a thickness of second film 200 deposited over first film 180. Tuning or controlling parameters (e.g., opening width $w_2$) of undercut region $R_1$ helps define parameters of a source region formed in undercut region $R_1$, as discussed in more detail in the disclosure.

In some embodiments, second film 200 may be deposited along first film 180. Second film 200 may additionally be deposited over gate cap(s) 164. Second film 200 may be deposited along first film 180 by selective deposition such that lower extent 202 of second film 200 may be substantially co-planar with lower extent 198 of first film 180 and does not extend below lower extent 198 of first film 180. In certain embodiments, film 200 may include one or more low-K dielectric materials, i.e., dielectric materials with a dielectric constant of at most approximately 3.9. In embodiments, film 200 may include one or more insulative oxide and/or nitride materials. It is to be understood that, like film 180, film 200 does not form part of gate structure(s) 120. Rather, films 180 and 200 are formed as preliminary spacer material(s) selected for ease of removal and replacement in subsequent processing. In some embodiments, film 200 may be preliminary spacer material(s) formed over portions of film 180 and over portions of gate structure(s) 120 and substrate 152. In some embodiments, second film 200 and first film 180 are composed of the same materials including, but not limited to, silicon nitride.

Figure 8:
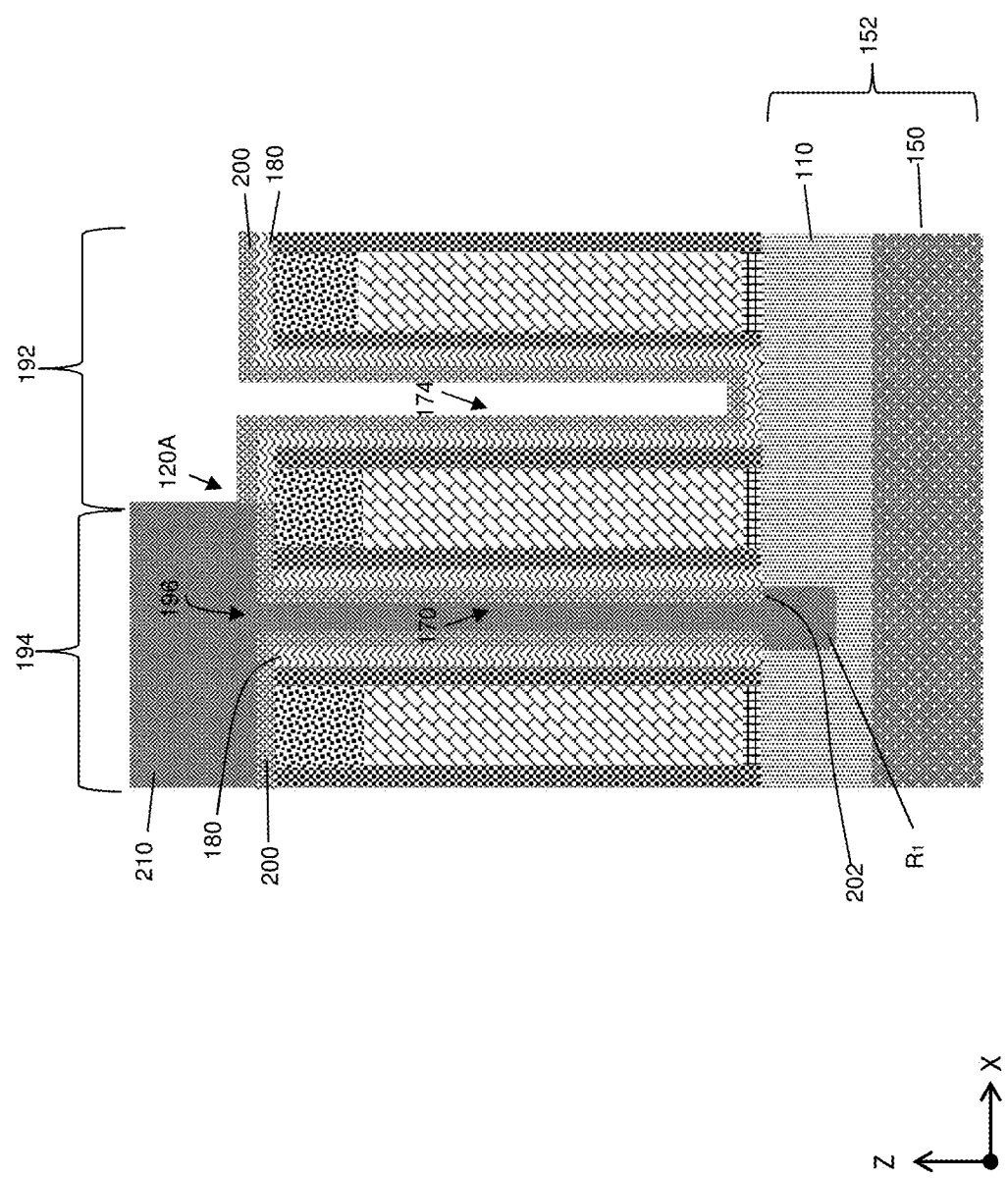
FIG. 8 shows a cross-sectional view of forming a second mask over the second semiconductor region according to embodiments of the disclosure.

Referring to FIG. 8, a second mask 210 may be formed to cover second semiconductor region 194 without covering first semiconductor region 192. Second mask 210 may be formed over and adjacent to first side 170 of gate structure 120. Mask 210 may include openings or otherwise may be structured to cover second semiconductor region 194 without covering first semiconductor region 192. First semiconductor region 192 not covered by mask 210 remains susceptible to processing when mask 210 remains in place over second semiconductor region 194 on substrate 152. As discussed herein, mask 210 may protect second semiconductor region 194 from being further recessed, implanted, etc. Mask 210 may be formed using any now known or later developed masking technique, and may include any now known or later developed masking material. For example, materials and formation methods described in conjunction with first mask 190 also apply to second mask 210 and will not be repeated here.

Figure 9:
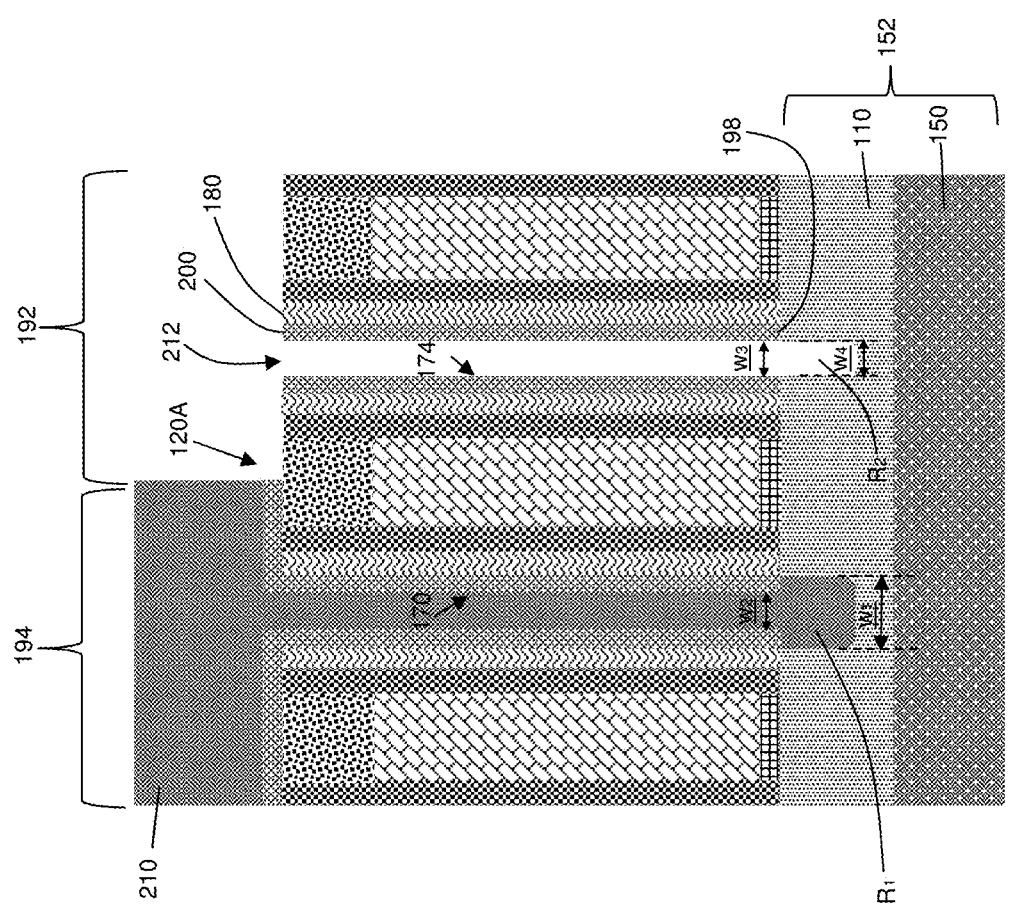
FIG. 9 shows a cross-sectional view of recessing the first semiconductor region according to embodiments of the disclosure.

Proceeding to FIG. 9, with mask 210 in place, further processing according to the disclosure may include etching a second portion of substrate 152, e.g., recessing a portion of substrate 152 in first semiconductor region 192 to second side 174 of gate structure 120, removing a portion of both first film 180 and second film 200 at second side 174 to form a second opening 212 over substrate 152. In embodiments, second opening 212 includes a region $R_2$ below lower extent 198 of first film 180. Second opening 212 may have an opening width ($w_3$) that is substantially uniform throughout.

Second semiconductor region 194 is unaffected during the etching. Portions of first semiconductor region 192 not covered by mask 210 or gate structure(s) 120 may be etched, e.g., using a downward directional etch. First semiconductor region 192 may be etched using an etchant selective to semiconductor materials. As portions of both first film 180 and second film 200 on first semiconductor region 192 at first side 170 of gate structure 120 is etched or recessed, gate structure 120 may protect portions of the fin material thereunder from being etched.

Figure 10:
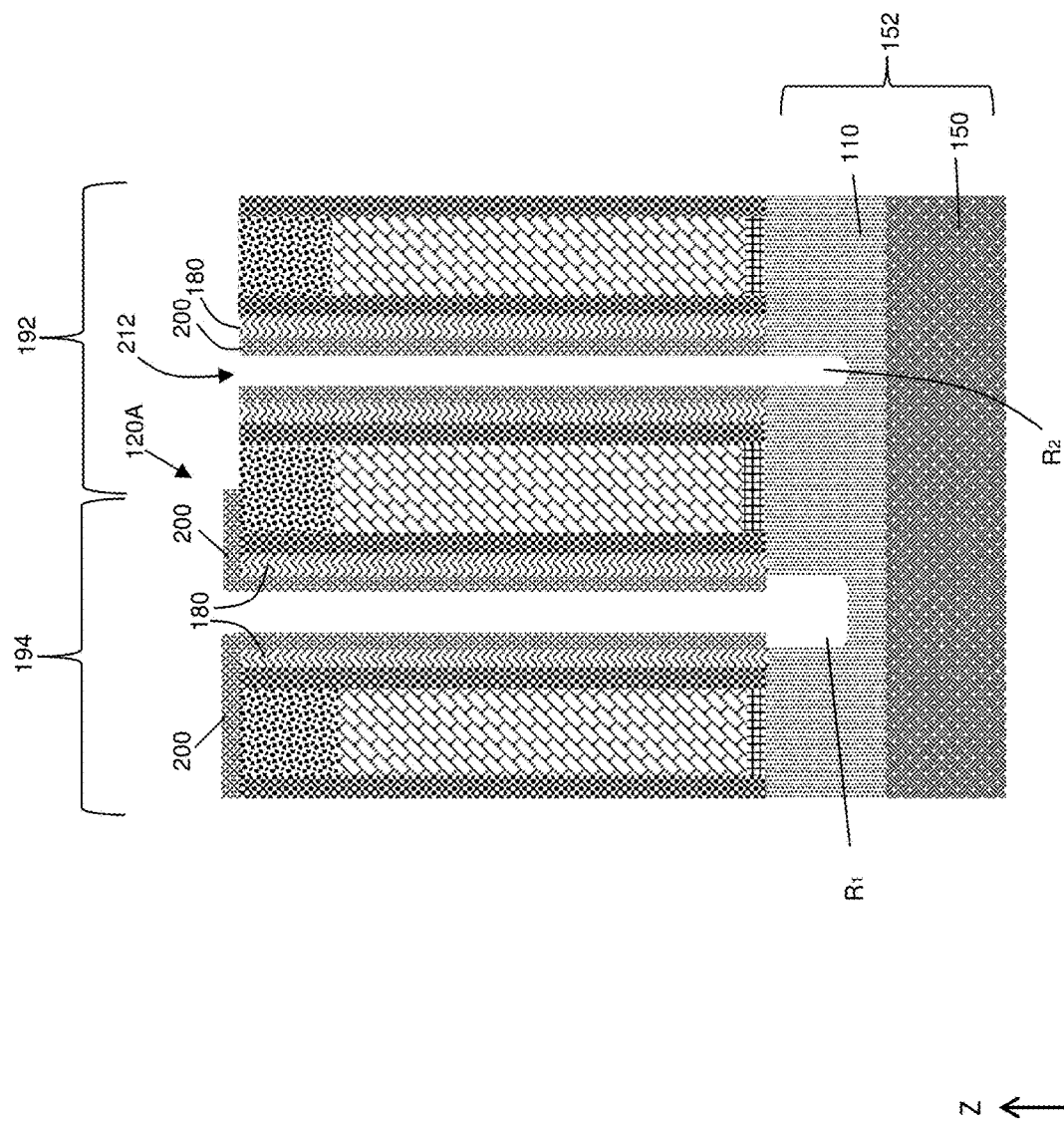
FIG. 10 shows a cross-sectional view of removing the second mask according to embodiments of the disclosure.

Proceeding to FIG. 10, second mask 210 may be removed from second semiconductor region 194 by any currently known or later developed technique including, but not limited to, stripping, selective etch, and/or other techniques suitable for mask removal.

The forming of first opening 196 including undercut region $R_1$ and second opening 212 including region $R_2$ are preliminary steps to grow source and drain regions on fin(s) 110 to provide functional elements of a transistor structure. As will be further illustrated in more detail with reference to FIGS. 11-16, embodiments according to the disclosure may include methods of forming a source region 220 (FIGS. 11-16) within first opening 196 (FIG. 7), and a drain region 222 (FIGS. 11-16) within second opening 212 (FIG. 9). In embodiments, method of forming source region 220 may include forming an upper source portion 270 (FIG. 14) above gate dielectric layer 162 and having a first lateral width ($LW_1$), and a lower source portion 272 (FIG. 14) below upper source portion 270 and having a second lateral width ($LW_2$) greater than first lateral width ($LW_1$). In embodiments, method of forming drain region 222 may include forming an upper drain portion 274 (FIG. 14) above gate dielectric layer 162 and having a third lateral width ($LW_3$), and a lower drain portion 276 (FIG. 14) below upper drain portion 274 and having a fourth lateral width ($LW_4$) that is substantially the same as third lateral width ($LW_3$). In embodiments, second lateral width ($LW_2$) of lower source portion 272 is greater than fourth lateral width ($LW_4$) of lower drain portion 276 (FIGS. 11-16). In certain embodiments, forming source region 220 may include forming source region 220 having a shape of an upside-down T (FIGS. 11-16). It is to be understood that the shape of source region 220 is not limited to an upside-down T, other shapes may also be implemented, as will be further discussed with regard to FIG. 14.

With further reference to FIGS. 11-16, in some embodiments, forming source region 220 may include forming lower source portion 272 having a first source sidewall 282 (FIG. 15) contacting a lower extent 284 (FIG. 15) of a first spacer 250 (FIGS. 13, 15) at a location 286 (FIG. 15) between a first outer spacer sidewall 256 (FIG. 15) of first spacer 250 and first gate sidewall 168 of gate structure 120. In certain embodiments, forming source region 220 and drain region 222 may include: forming lower source portion 272 having first source sidewall 282 laterally offset from first gate sidewall 168 of gate structure 120 to a first lateral distance ($d_1$, FIG. 15); and forming lower drain portion 276 having a first drain sidewall 290 aligned with a second outer spacer sidewall 260 (FIG. 16) of a second spacer 252 (FIG. 13), where first drain sidewall 290 is laterally offset from second gate sidewall 172 of gate structure 120 to a second lateral distance ($d_2$, FIG. 16) that is greater than first lateral distance ($d_1$, FIG. 15). In embodiments, forming source region 220 may include forming lower source portion 272 having first source sidewall 282 and an opposite, second source sidewall 288 (FIG. 15) substantially parallel to first source sidewall 282. In embodiments, forming source region 220 may include forming upper source portion 270 having a third source sidewall 289 (FIG. 15) that abuts a portion of first outer spacer sidewall 256 of first spacer 250. In embodiments, forming drain region 222 may include forming lower drain portion 276 having first drain sidewall 290 (FIG. 16) aligned with second outer spacer sidewall 260 (FIG. 16) of second spacer 252, and an opposite, second drain sidewall 292 (FIG. 16) substantially parallel to first drain sidewall 290. In embodiments, method of forming structure 300 may include forming first spacer 250 (FIG. 13) contacting first gate sidewall 168 (FIG. 2) of gate structure 120, and a second spacer 252 (FIG. 13) contacting opposite, second gate sidewall 172 (FIG. 2) of gate structure 120. Forming first spacer 250 may include forming first spacer 250 having a first lateral thickness ($T_1$, FIG. 13), and forming second spacer 252 includes forming second spacer 252 having a second lateral thickness ($T_2$, FIG. 13) that is substantially the same as first lateral thickness ($T_1$) of first spacer 250.

Figure 11:
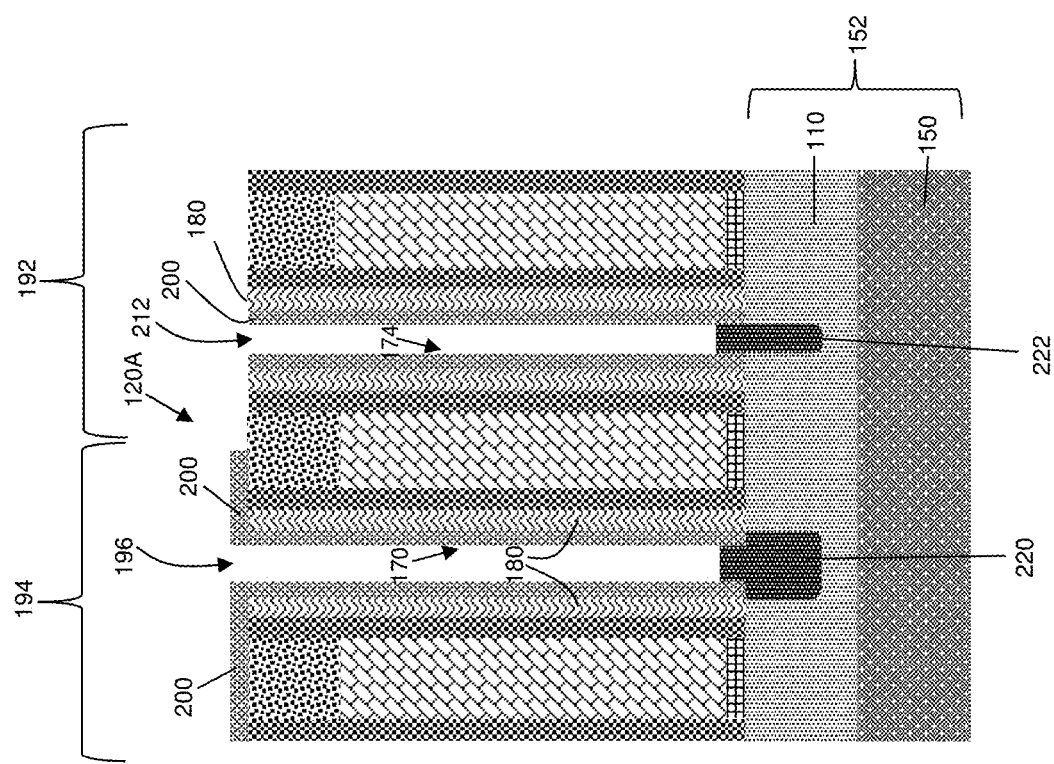
FIG. 11 shows a cross-sectional view of forming source and drain regions according to embodiments of the disclosure.

Referring now to FIG. 11 in detail, embodiments of the disclosure include forming source region 220 within first opening 196 (FIG. 7), and forming drain region 222 within second opening 212 (FIG. 9). Source and drain regions 220, 222 may be formed, for example, by epitaxially growing source and drain materials within openings 196 and 212, respectively. Epitaxially grown source and drain materials may be formed by any currently known or later developed techniques suitable for epitaxial growth including, but not limited to, drive-in anneal and ion implementation. Source and drain regions 220, 222 on opposite sides 170, 174 of each gate structure 120 may provide source and drain terminals of a transistor formed from fin(s) 110.

Source and drain regions 220, 222 may have a different material composition from the remainder of fin(s) 110. Gate structure(s) 120 may shield a portion of fin(s) 110 as source and drain regions 220, 222 are being formed. Source and drain regions 220, 222 may include one or more semiconductor materials of fin(s) 110, or a different semiconductor material, but with dopants therein. Implanting dopants into source and drain regions 220, 222 may provide greater conductivity than other portions of fin(s) 110. These properties may allow source and drain regions 220, 222 to form the eventual source and drain regions of a transistor. In some cases, source and drain regions 220, 222 may be implanted with a strain-inducing material, such as germanium or carbon. The dopants used to form source and drain regions 220, 222 may be introduced in situ or an implantation process may be performed to affect only source and drain regions 220, 222. According to an example, fin(s) 110 is not previously doped before source and drain regions 220, 222 are formed. In some cases, an additional mask (not shown) may be formed over one of source and drain regions 220, 222 while the other one of source and drain regions 220, 222 is doped, e.g., to give each source and drain regions 220, 222 a different doping profile, and/or dopant material, with respect to the other.

Figure 12:
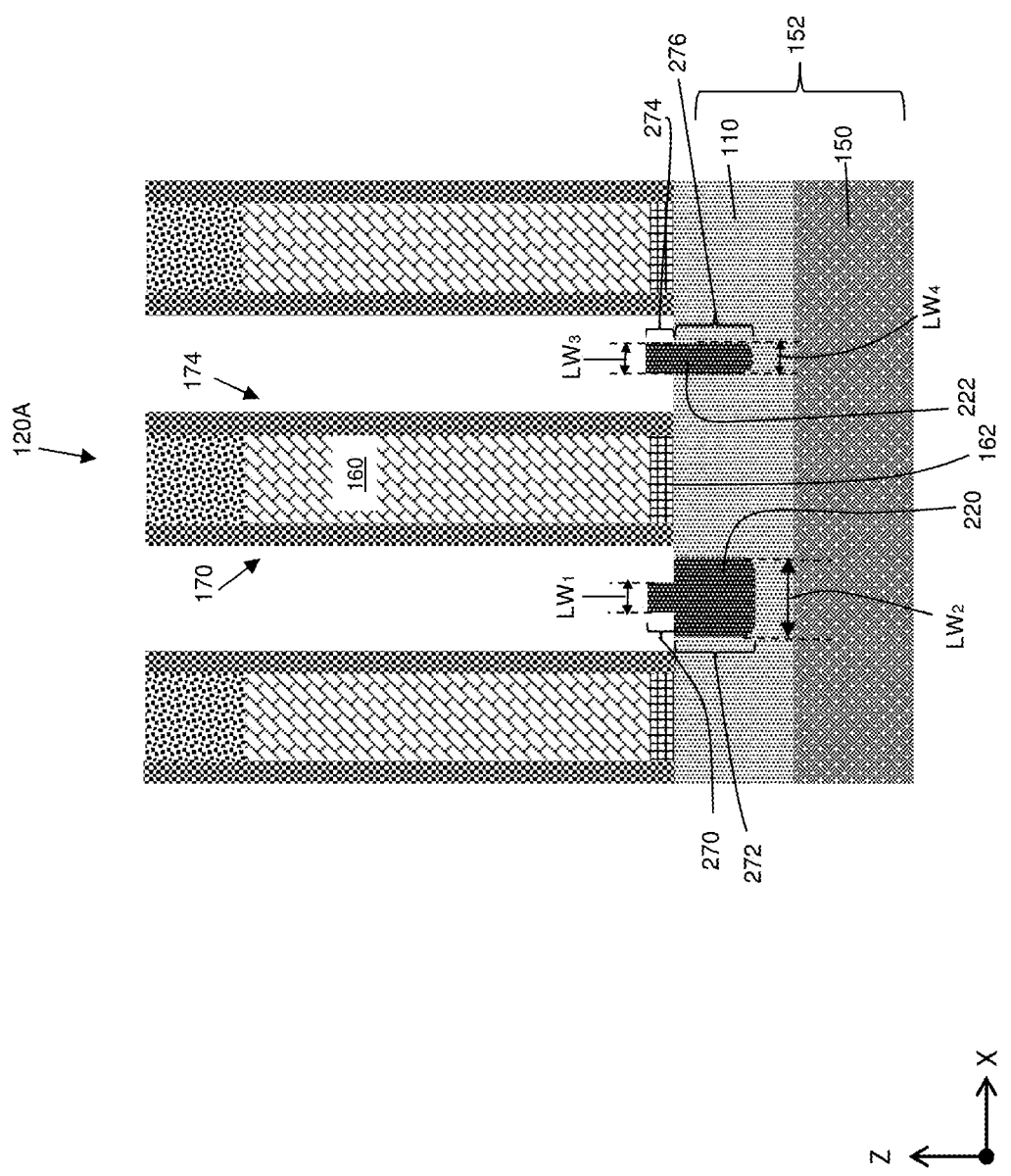
FIG. 12 shows a cross-sectional view of removing first and the second films according to embodiments of the disclosure.

Referring to FIG. 12, as discussed earlier, first film 180 and/or second film 200 (FIGS. 3-11) as noted herein may be a placeholder insulator material, to be replaced with a spacer material before a transistor structure is formed. Continued processing thus may include removing first film 180 and/or second film 200 and forming one or more spacer materials in its/their place. First film 180 and/or second film 200 may be removable through any currently known or later developed technique suitable for selectively removing insulative materials. For example, first film 180 and/or second film 200 may be removed by stripping, i.e., a process in which insulative materials and/or previously-deposited photomasks are removed from a surface of another material. Stripping may occur, e.g., after processes such as etching or ion implantation. Stripping may involve the use of wet or dry (ashing) strongly oxidizing chemistries. Suitable etching materials may depend on the composition of first film 180 and/or second film 200, and/or the composition of materials not positioned below or adjacent to first film 180 and/or second film 200. In some embodiments, first film 180 and/or second film 200 may be thinned, but not fully removed. As illustrated in FIG. 12, after removal or partial removal of films 180, 200, source and drain regions 220, 222 maintain respective lateral widths within fin(s) 110. As to be discussed in more detail later in the disclosure, source region 220 may include upper source portion 270 above gate dielectric layer 162 and having first lateral width ($LW_1$), and lower source portion 272 below upper source portion 270 and having second lateral width ($LW_2$) that is greater than first lateral width ($LW_1$). Drain region 222 may include upper drain portion 274 above gate dielectric layer 162 and having third lateral width ($LW_3$), and lower drain portion 276 below upper drain portion 274 and having fourth lateral width ($LW_4$) that is substantially the same as third lateral width ($LW_3$). In embodiments, lower source portion 272 and lower drain portion 276 are both below gate dielectric layer 162. Differences in lateral widths ($LW_1$, $LW_2$, $LW_3$, $LW_4$) may be controlled by controlling parameters such as thicknesses of films 180, 200 deposited.

Figure 13:
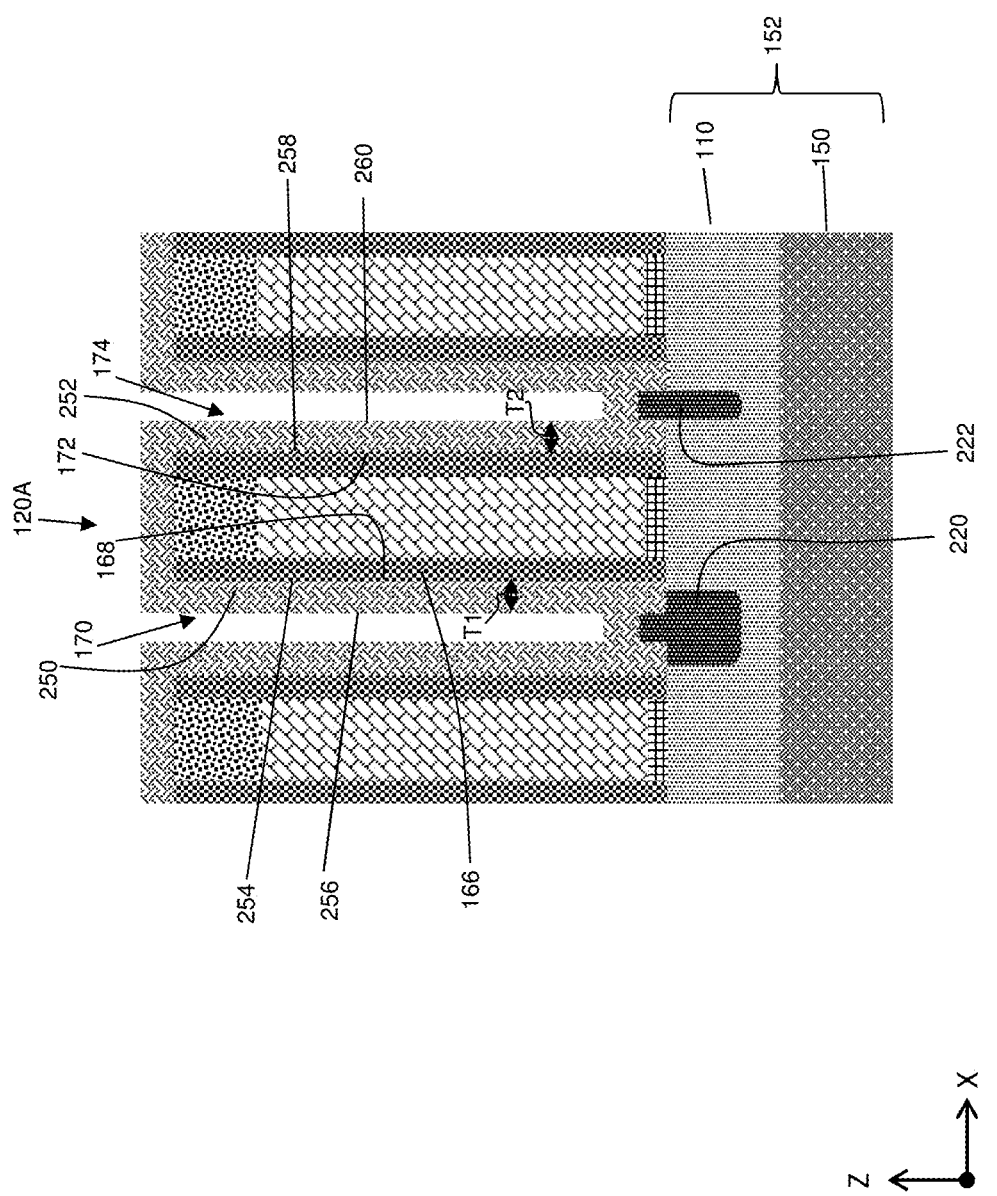
FIG. 13 shows a cross-sectional view of forming a first spacer and a second spacer according to embodiments of the disclosure.

Turning now to FIG. 13, after the removing of first film 180 and/or second film 200, spacer materials may be formed on exposed surfaces of the remaining semiconductor and gate structure(s) 120. Spacer(s) may be conformally deposited on fin(s) 110 and gate structure(s) 120 to coat exposed surfaces thereof. In FIG. 13, first spacer 250 and second spacer 252 are shown as non-limiting examples. First spacer 250 may include a first inner spacer sidewall 254 adjacent to first gate sidewall 168 of gate structure 120, and first outer spacer sidewall 256 opposite to first inner spacer sidewall 254. Second spacer 252 may include a second inner spacer sidewall 258 adjacent to second gate sidewall 172 of gate structure 120, and second outer spacer sidewall 260 opposite to second inner spacer sidewall 258. First spacer 250 and second spacer 252 may be formed together or separately.

Spacers 250, 252 may include one or more insulative materials different from those included within insulator layer(s) 166 (FIG. 2) of gate structure(s) 120. Spacers 250, 252 may include one or more insulative oxides, nitrides, and/or other electrically insulative materials described herein. Spacers 250, 252 in some cases may include one or more low-k dielectric materials capable of being selectively or non-selectively deposited as a film of dielectric material. In embodiments, spacers 250, 252 are conformally deposited. Non-limiting examples of materials capable of being conformally deposited as spacers 250, 252 may include, but not limited to, silicon oxycarbonnitride (SiOCN) and/or silicon oxycarbide (SiOC). In the case of a single conformal deposition, spacers 250, 252 may also be conformally deposited on portions of STI 140.

Figure 14:
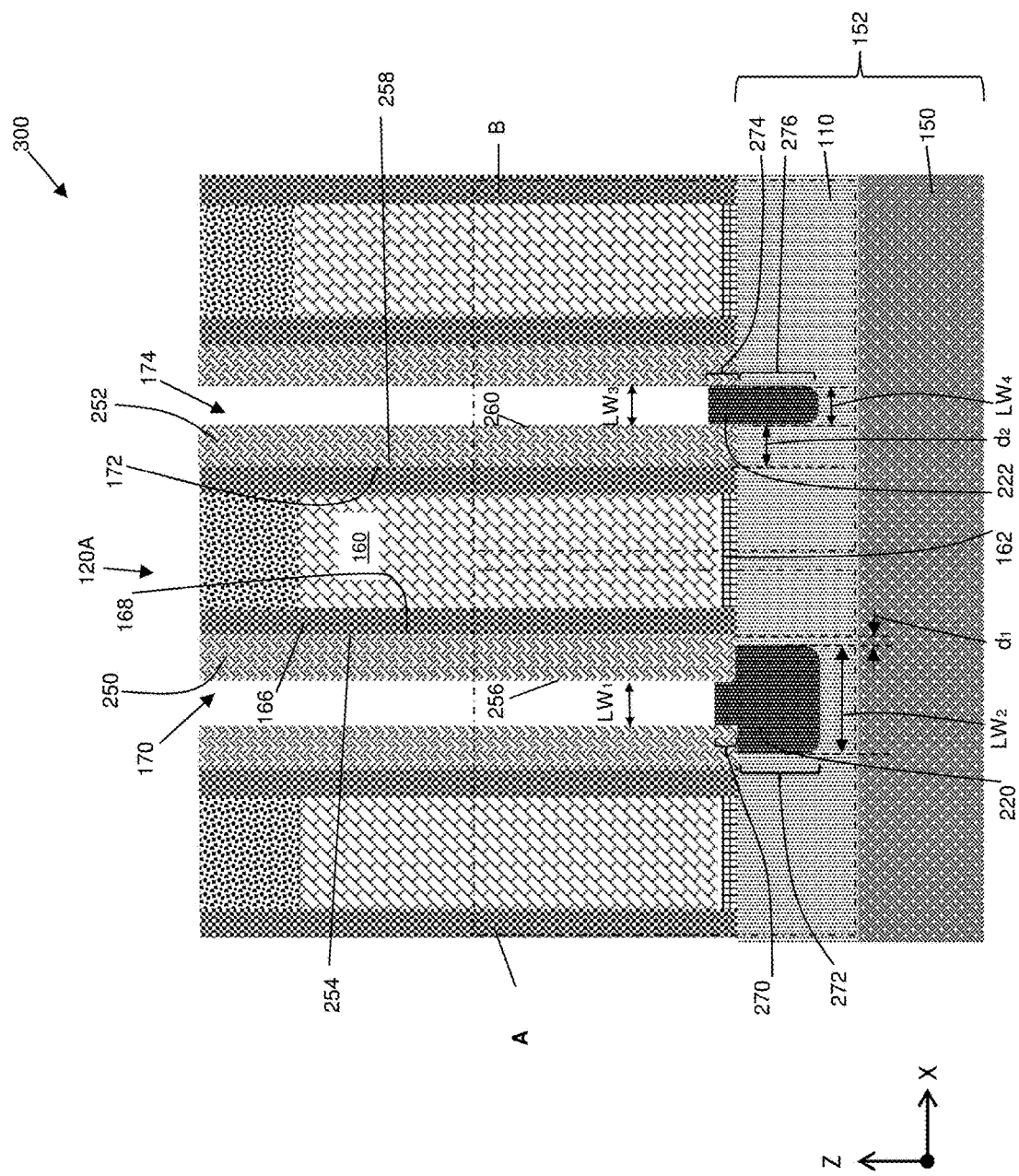
FIG. 14 shows a cross-sectional view of an IC structure according to embodiments of the disclosure.

Proceeding to FIG. 14, various portions of spacers 250, 252 may be removed, e.g., by etching, such that remaining portions of spacers 250, 252 are positioned exclusively on or over gate structure(s) 120. Spacers 250, 252 may be removed by any currently known or later developed technique including, but not limited to, selective etch, and/or other techniques suitable for spacers material removal.

Further referring to FIG. 14, a non-limiting embodiment of IC structure 300 formed according to methods of the present disclosure is illustrated. IC structure 300 may include, but is not limited to: substrate 152; gate structure 120 over substrate 152, gate structure 120 having first gate sidewall 168 and opposite, second gate sidewall 172 and including gate region 160 and gate dielectric layer 162 formed under gate region 160; first spacer 250 contacting first gate sidewall 168 of gate structure 120; second spacer 252 contacting opposite, second gate sidewall 172 of gate structure 120; and source region 220 and drain region 222 adjacent and on opposite sides 170, 174 of gate structure 120. Source region 220 may include upper source portion 270 above gate dielectric layer 162 and having first lateral width $LW_1$, and lower source portion 272 below upper source portion 270 and having second lateral width $LW_2$ that is greater than first lateral width $LW_1$. Drain region 222 may include upper drain portion 274 above gate dielectric layer 162 and having third lateral width $LW_3$, and lower drain portion 276 below upper drain portion 274 and having fourth lateral width $LW_4$ that is substantially the same as third lateral width $LW_3$.

Certain embodiments of the present disclosure provides structures with asymmetric source and drain regions. For example, in certain embodiments, second lateral width $LW_2$ of lower source portion 272 is greater than fourth lateral width $LW_4$ of lower drain portion 276. In some embodiments, source region 220 may have a shape of an upside-down T. It is to be understood that the shape of source region 220 is not limited to an upside-down T. Other shapes may also be implemented, providing embodiments with upper source portion 270 above gate dielectric layer 162 and having first lateral width $LW_1$, and lower source portion 272 below gate dielectric layer 162 having second lateral width $LW_2$ that is greater than first lateral width $LW_1$.

Figure 15:
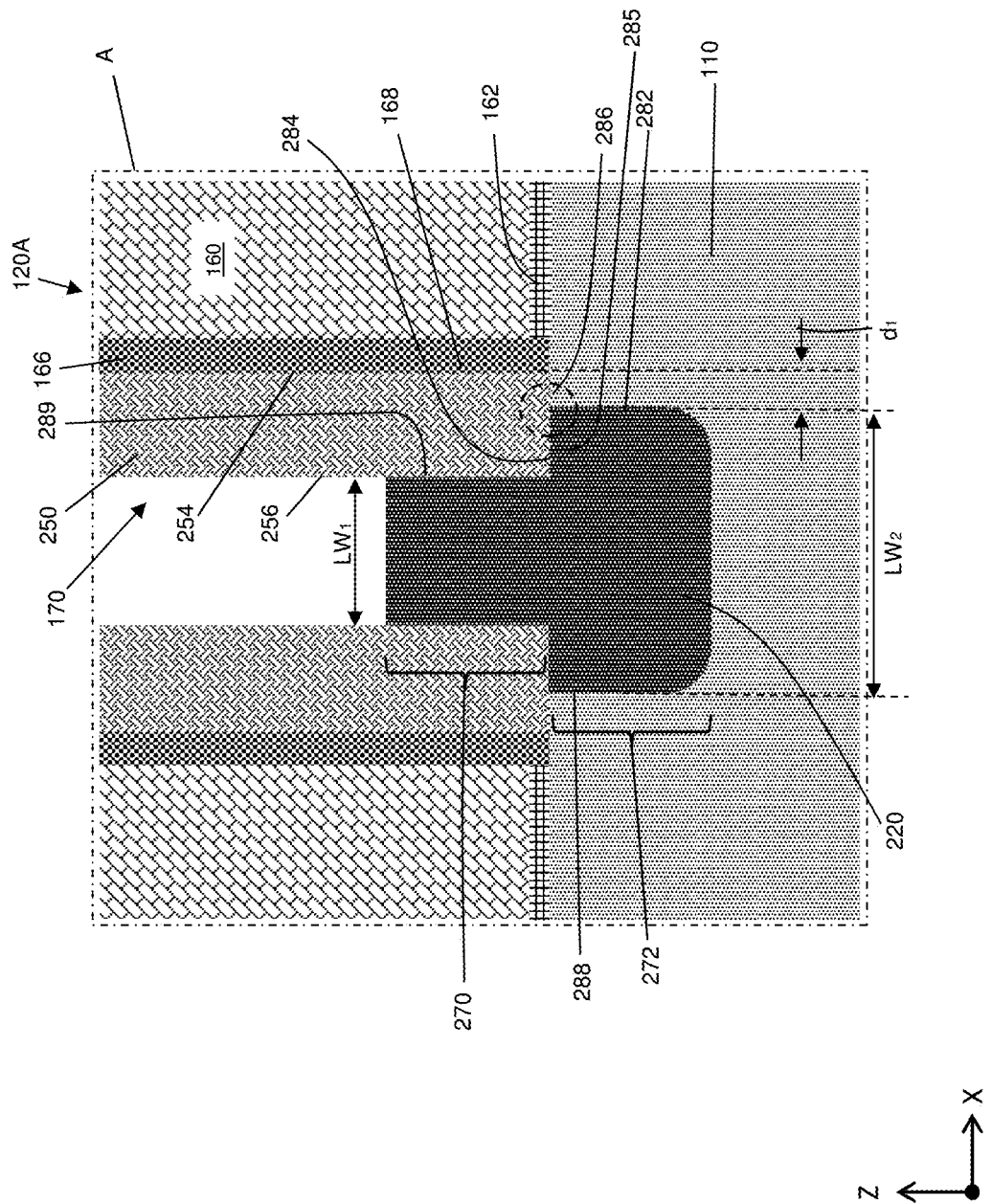
FIG. 15 shows enlarged, partial cross-sectional view of region A in the IC structure of FIG. 14 according to embodiments of the disclosure.
Figure 16:
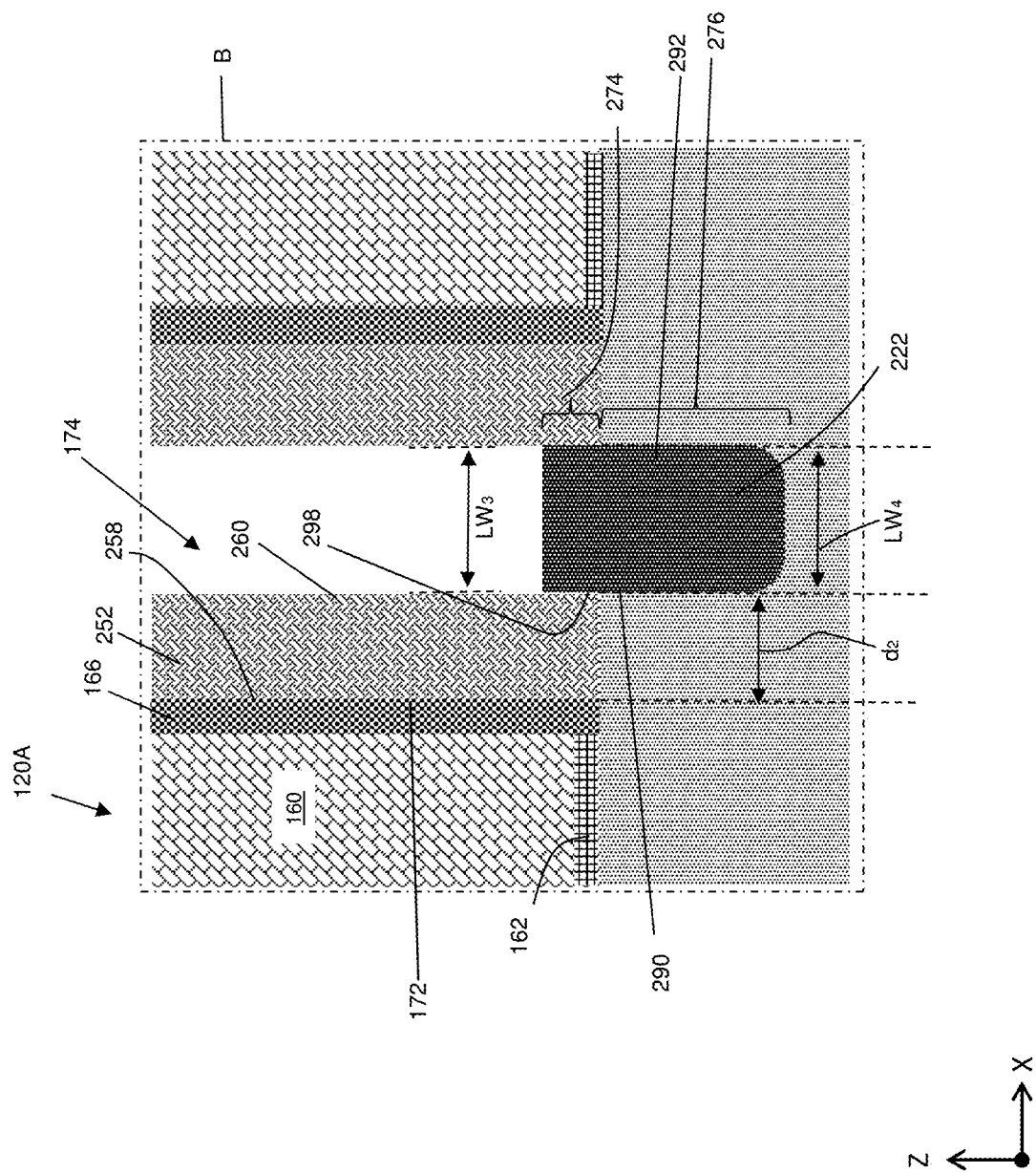
FIG. 16 shows enlarged, partial cross-sectional view of region B in the IC structure of FIG. 14 according to embodiments of the disclosure.

FIGS. 15 and 16 show enlarged, partial cross-sectional views of regions A and B, respectively, in the embodiments of FIG. 14. As illustrated in FIG. 15, in certain embodiments, lower source portion 272 of source region 220 has first source sidewall 282 contacting lower extent 284 of first spacer 250 at location 286 between first outer spacer sidewall 256 of first spacer 250 and first gate sidewall 168 of gate structure 120A. In some embodiments, location 286 may be between first outer spacer sidewall 256 of first spacer 250 and first inner spacer sidewall 254 of first spacer 250. In some embodiments, lower source portion 272 of source region 220 has an upper extent 285 including a portion that abuts lower extent 284 of first spacer 250.

In some embodiments, lower source portion 272 of source region 220 has first source sidewall 282 and opposite, second source sidewall 288 substantially parallel to first source sidewall 282. In embodiments, upper source portion 270 of source region 220 has third source sidewall 289 that abuts a portion of first outer spacer sidewall 256 of first spacer 250.

As illustrated in FIG. 16, in embodiments, lower drain portion 276 of drain region 222 has first drain sidewall 290 aligned with second outer spacer sidewall 260 of second spacer 252, and opposite, second drain sidewall 292 substantially parallel to first drain sidewall 290. In some embodiments, upper drain portion 274 of drain region 222 has a third drain sidewall 298 that abuts a portion of second outer spacer sidewall 260 of second spacer 252.

Referring to FIGS. 15 and 16 together, in embodiments, lower source portion 272 of source region 220 has first source sidewall 282 that is laterally offset from first gate sidewall 168 of gate structure 120 to first lateral distance ($d_1$). Lower drain portion 276 of drain region 222 has first drain sidewall 290 that is aligned with second outer spacer sidewall 260 of second spacer 252 and is laterally offset from second gate sidewall 172 of gate structure 120 to second lateral distance ($d_2$) that is greater than first lateral distance ($d_1$).

Figure 17:
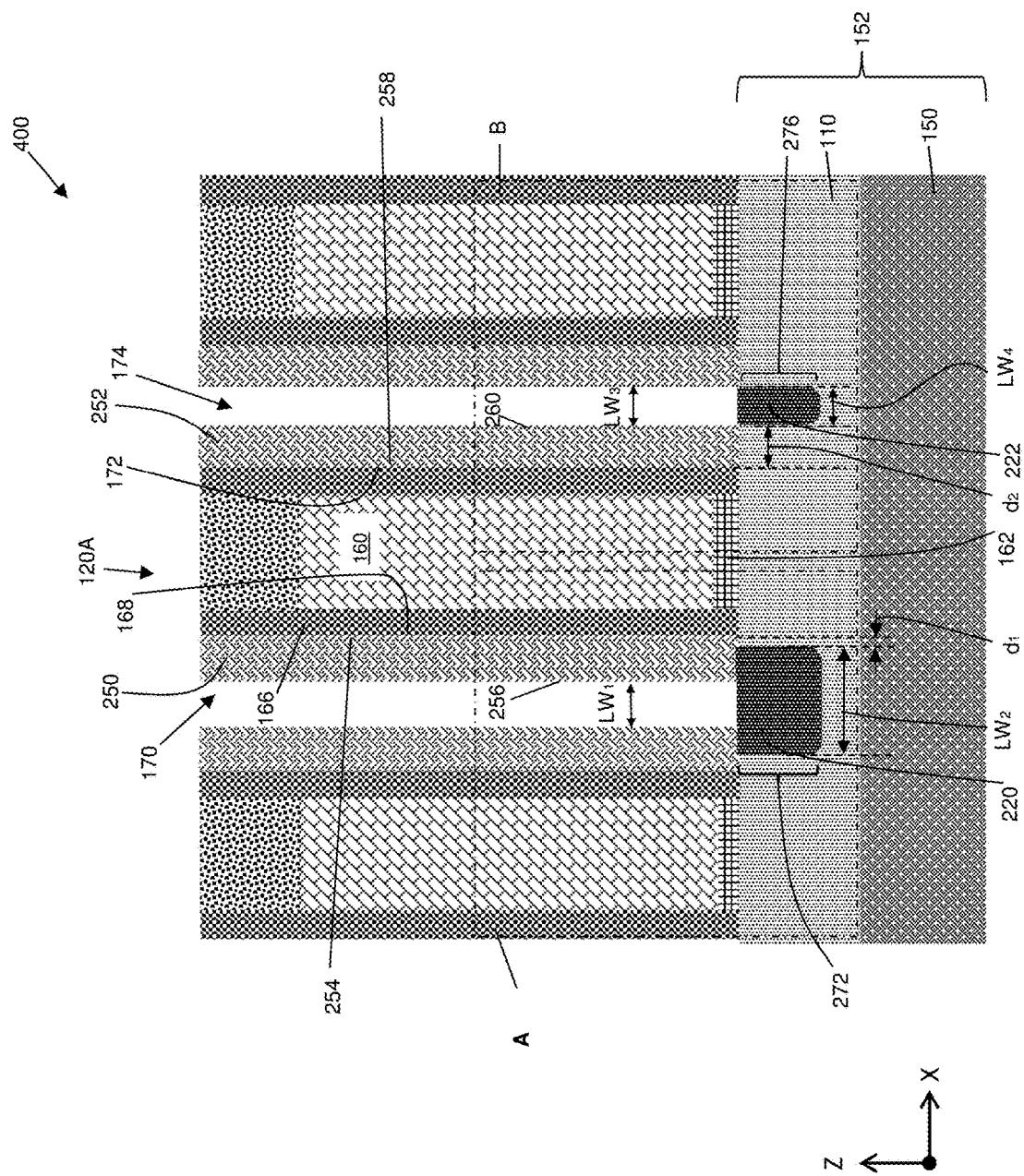
FIG. 17 shows a cross-sectional view of an IC structure according to embodiments of the disclosure.
Figure 18:
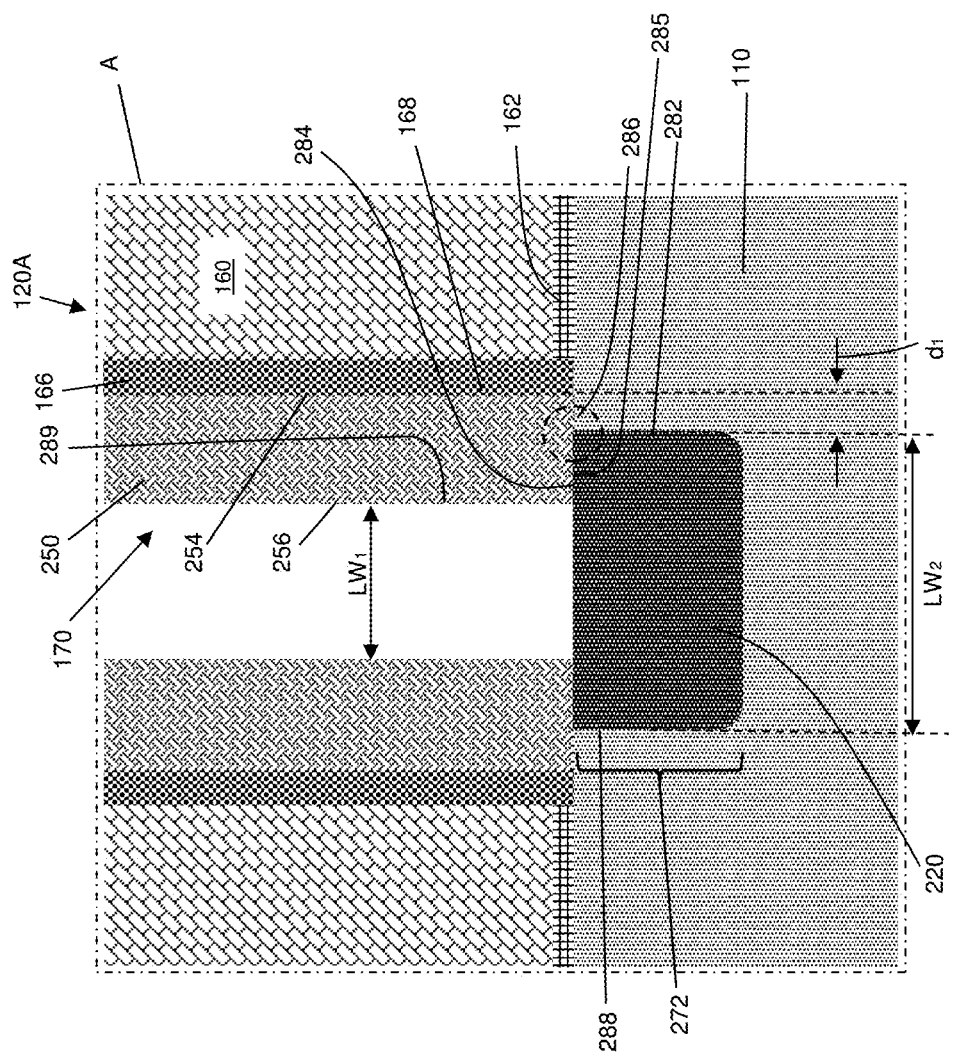
FIG. 18 shows enlarged, partial cross-sectional view of region A in the IC structure of FIG. 17 according to embodiments of the disclosure.
Figure 19:
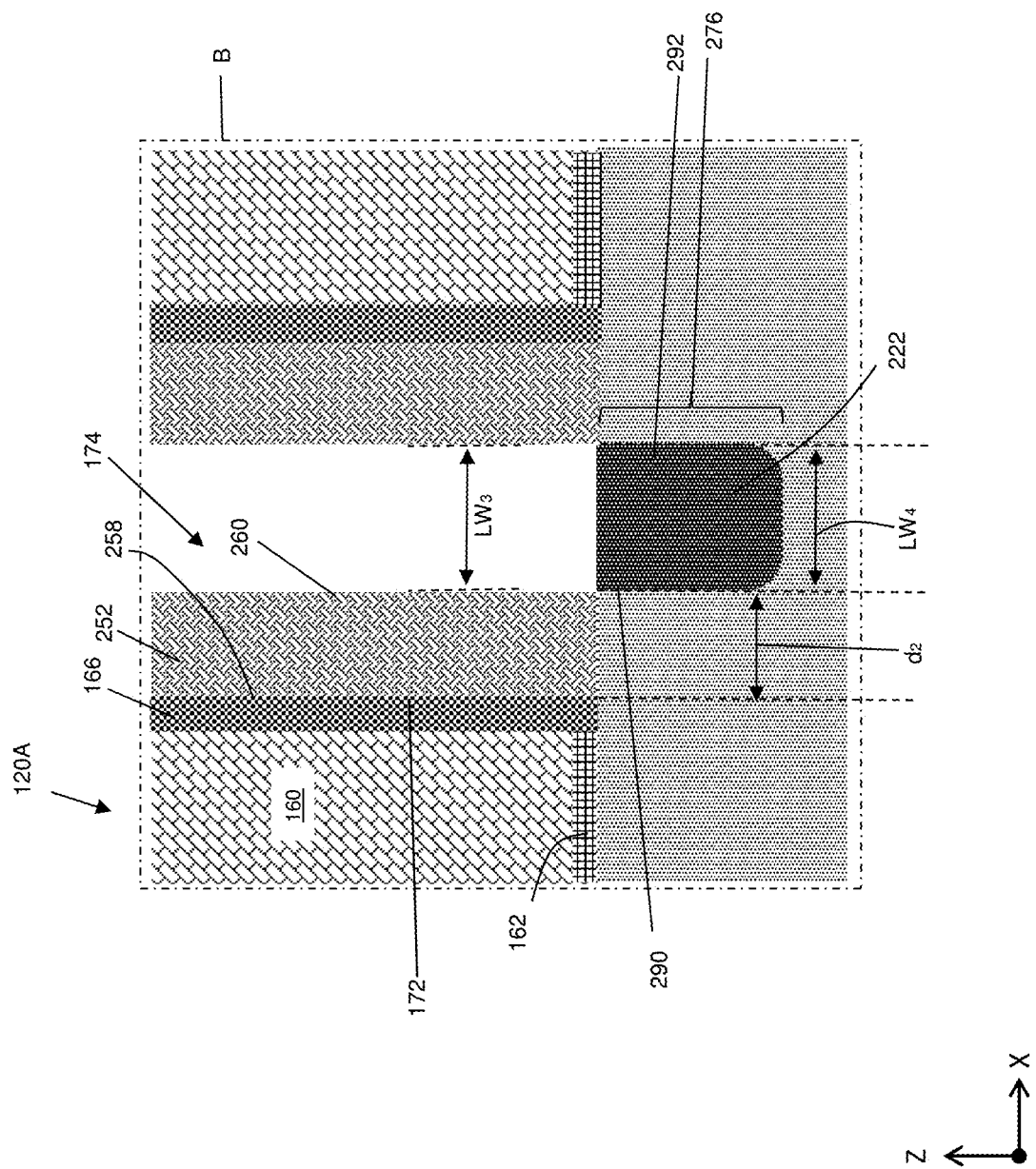
FIG. 19 shows enlarged, partial cross-sectional view of region B in the IC structure of FIG. 17 according to embodiments of the disclosure.

In FIG. 17, a non-limiting example of alternative embodiment of IC structure 400 formed according to methods of the present disclosure is illustrated. FIGS. 18 and 19 show enlarged, partial cross-sectional views of regions A and B, respectively, in the embodiments of FIG. 17. In FIGS. 17-19, source region 220 and drain region 222 do not extend above gate dielectric layer 162 and/or fins 110, like in earlier embodiments. That is, during source region 220 and drain region 222 formation, e.g., in FIG. 11, they are not formed to extend above active semiconductor regions, e.g., fins 110, or extend above gate dielectric layer 162. IC structure 400 may include, but is not limited to: substrate 152; gate structure 120A over substrate 152, gate structure 120 having first gate sidewall 168 and opposite, second gate sidewall 172 and including gate region 160 and gate dielectric layer 162 formed under gate region 160; first spacer 250 contacting first gate sidewall 168 of gate structure 120; second spacer 252 contacting opposite, second gate sidewall 172 of gate structure 120; and source region 220 and drain region 222 adjacent and on opposite sides 170, 174 of gate structure 120. Source region 220 may include source portion 272 below gate dielectric layer 162. Drain region 222 may include drain portion 276 below gate dielectric layer 162. As more clearly illustrated in FIGS. 18 and 19 together, in embodiments, source portion 272 of source region 220 has first source sidewall 282 (FIG. 18) that is laterally offset from first gate sidewall 168 of gate structure 120 to first lateral distance ($d_1$). Drain portion 276 of drain region 222 has first drain sidewall 290 (FIG. 19) that is laterally offset from second gate sidewall 172 of gate structure 120 to second lateral distance ($d_2$) that is greater than first lateral distance ($d_1$).

As illustrated in FIG. 18, in certain embodiments, source portion 272 of source region 220 has first source sidewall 282 and opposite, second source sidewall 288 substantially parallel to first source sidewall 282. Source portion 272 of source region 220 may have first source sidewall 282 contacting lower extent 284 of first spacer 250 at location 286 between first outer spacer sidewall 256 of first spacer 250 and first gate sidewall 168 of gate structure 120. In some embodiments, location 286 may be between first outer spacer sidewall 256 of first spacer 250 and first inner spacer sidewall 254 of first spacer 250. In certain embodiments, source portion 272 of source region 220 has an upper extent 285 including a portion that abuts lower extent 284 of first spacer 250.

As illustrated in FIG. 19, in certain embodiments, drain portion 276 of drain region 222 has first drain sidewall 290 aligned with second outer spacer sidewall 260 of second spacer 252. In some embodiments, drain portion 276 of drain region 222 has opposite, second drain sidewall 292 substantially parallel to first drain sidewall 290.

The embodiments of the present disclosure include asymmetric source and drain regions. For example, lower source portion 272 of source region 220 may be considered as in a "pushed-in" configuration, or in a closer proximity (with a smaller lateral offset or distance $d_1$) to first gate sidewall 168 of gate structure 120 while lower drain portion 276 of drain region 222 may be considered as in a "pushed-out" configuration (with a greater lateral offset or distance $d_2$) from second gate sidewall 172 of gate structure 120. The asymmetric arrangement of source and drain regions provides various benefits including, but not limited to, enhancing a maximum stable gain (MSG) of device performance.

It is discovered that the embodiments of current disclosure may provide increased $g_m$ by lowering source region resistance ($R_s$) with a "pushed-in" configuration of source region 220, while simultaneously lowering gate-to-drain capacitance ($C_{gd}$) with a "pushed-out" configuration of drain region 222, thereby achieving a significantly enhanced MSG compared to embodiments having symmetric source and drain regions. In embodiments having symmetric source and drain regions, lower source portion 272 of source region 220 may have same lateral width ($LW_2$) as that of lower drain portion 276 of drain region 222 ($LW_4$). In contrast, in IC structures having symmetric source and drain regions, upper source portion 270 of source region 220 may have same lateral width ($LW_1$) as that of lower source portion 272 of source region 220 ($LW_2$). In IC structures having symmetric source and drain regions, a sidewall of the source and a sidewall of the drain region may have same lateral offset or distance from respective, adjacent gate sidewalls.

It is noted that various modifications and variations of asymmetric source and drain regions, while not being explicitly elaborated here for brevity, will be apparent to those of ordinary skill in the art without departing from the scope and spirit of the disclosure, and are intended to be part of this disclosure.

The present disclosure provides IC structures including, for example, an engineered finFET device with asymmetric source and drain regions having simultaneously reduced source resistance ($R_s$) and gate-to-drain capacitance ($C_{gd}$), thereby achieving an enhanced performance for applications such as RF applications.

The methods as described above may be used in the fabrication of integrated circuit chips. The resulting integrated circuit chips may be distributed by the fabricator in a raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Where an element or layer is referred to as being "on," "engaged to," "connected to" or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

In addition, several descriptive terms may be used regularly herein, as described below. The terms "first", "second", and "third" may be used interchangeably to distinguish one component from another and are not intended to signify location or importance of the individual components.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. "Substantially" as applied to a particular value may indicate +/−10% of the stated value. In at least some instances, the approximating language may correspond to the precision of an instrument for measuring the value.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a substrate;
   a gate structure over the substrate, the gate structure having a first gate sidewall and an opposite, second gate sidewall, and including a gate region and a gate dielectric layer under the gate region;
   a first spacer contacting the first gate sidewall of the gate structure;
   a second spacer contacting the opposite, second gate sidewall of the gate structure; and a source region and a drain region adjacent and on opposite sides of the gate structure, wherein the source region includes an upper source portion above the gate dielectric layer and having a first lateral width, and a lower source portion below the upper source portion and having a second lateral width greater than the first lateral width, and wherein the drain region includes an upper drain portion above the gate dielectric layer and wherein the drain region has a substantially uniform lateral width.

2. The IC structure of claim 1, wherein the second lateral width of the lower source portion is greater than the substantially uniform lateral width of the drain region.

3. The IC structure of claim 1, wherein the source region has a shape of an upside-down T.

4. The IC structure of claim 1, wherein the lower source portion has a first source sidewall contacting a lower extent of the first spacer at a location between a first outer spacer sidewall of the first spacer and the first gate sidewall of the gate structure.

5. The IC structure of claim 4, wherein the first source sidewall of the lower source portion is laterally offset from the first gate sidewall of the gate structure to a first lateral distance, and wherein the drain region has a first drain sidewall aligned with a second outer spacer sidewall of the second spacer and is laterally offset from the second gate sidewall of the gate structure to a second lateral distance that is greater than the first lateral distance.

6. The IC structure of claim 1, wherein the lower source portion has a first source sidewall and an opposite, second source sidewall substantially parallel to the first source sidewall.

7. The IC structure of claim 1, wherein the lower source portion has an upper extent including a portion that abuts a lower extent of the first spacer.

8. The IC structure of claim 1, wherein the upper source portion has a third source sidewall that abuts a portion of a first outer spacer sidewall of the first spacer.

9. The IC structure of claim 1, wherein the drain region has a first drain sidewall aligned with a second outer spacer sidewall of the second spacer, and an opposite, second drain sidewall substantially parallel to the first drain sidewall.

10. The IC structure of claim 1, wherein the upper drain portion has a third drain sidewall that abuts a portion of a second outer spacer sidewall of the second spacer.

11. An integrated circuit (IC) structure, comprising:
a substrate;
a gate structure over the substrate, the gate structure having a first gate sidewall and an opposite, second gate sidewall, and including a gate region and a gate dielectric layer under the gate region;
a first spacer contacting the first gate sidewall of the gate structure;
a second spacer contacting the opposite, second gate sidewall of the gate structure; and
a source region and a drain region adjacent and on opposite sides of the gate structure, the drain region having a substantially uniform lateral width, and wherein the source region includes:
a first source sidewall that is laterally offset from the first gate sidewall of the gate structure to a first lateral distance,
an upper source portion above the gate dielectric layer and having a first lateral width, and
a lower source portion below both the gate dielectric layer and the upper source portion, the lower source portion having a second lateral width greater than the first lateral width, wherein the drain region includes:
a first drain sidewall that is laterally offset from the second gate sidewall of the gate structure to a second lateral distance that is greater than the first lateral distance, and
an upper drain portion above the gate dielectric layer.

12. The IC structure of claim 11, wherein the first source sidewall contacts a lower extent of the first spacer at a location between a first outer spacer sidewall of the first spacer and the first gate sidewall of the gate structure.

13. The IC structure of claim 11, wherein the first drain sidewall is aligned with a second outer spacer sidewall of the second spacer.

14. The IC structure of claim 11, wherein the source portion has an opposite, second source sidewall substantially parallel to the first source sidewall, and the drain portion has an opposite, second drain sidewall substantially parallel to the first drain sidewall.

15. The IC structure of claim 11, wherein the source region further includes an upper source portion above the gate dielectric layer, the upper source portion having a third source sidewall that abuts a portion of a first outer spacer sidewall of the first spacer.

16. The IC structure of claim 11, the second lateral width is wider than the drain region.

17. A method of forming an integrated circuit (IC) structure, the method comprising:
forming a gate structure over a substrate, the gate structure having a first gate sidewall on a first side of the gate structure, and a second gate sidewall on a second side of the gate structure opposite to the first side, and the gate structure further including a gate region and a gate dielectric layer formed under the gate region;
forming a source region in a first opening including an undercut region adjacent to the first side of the gate structure, the source region including an upper source portion above the gate dielectric layer and having a first lateral width, and a lower source portion below the upper source portion and having a second lateral width greater than the first lateral width;
forming a drain region in a second opening adjacent to the second side of the gate structure, wherein the drain region has a uniform lateral width and wherein the drain region includes an upper drain portion above the gate dielectric layer; and
forming a first spacer contacting the first gate sidewall of the gate structure, and a second spacer contacting the second gate sidewall of the gate structure.

18. The method of claim 17, wherein the lower source portion has a first source sidewall that is laterally offset from the first gate sidewall of the gate structure to a first lateral distance, and wherein the drain region has a first drain sidewall that is laterally offset from the second gate sidewall of the gate structure to a second lateral distance that is greater than the first lateral distance.

* * * * *